(12) United States Patent
Huang

(10) Patent No.: US 11,774,177 B2
(45) Date of Patent: Oct. 3, 2023

(54) WATER-COOLING HEAT DISSIPATION DEVICE

(71) Applicant: Huizhou Hanxu Hardware Plastic Technology Co., Ltd., Huizhou (CN)

(72) Inventor: Tsung-Hsien Huang, Huizhou (CN)

(73) Assignee: HUIZHOU HANXU HARDWARE PLASTIC TECHNOLOGY CO., LTD., Guangdong (CN)

( * ) Notice: Subject to any disclaimer, the term of this patent is extended or adjusted under 35 U.S.C. 154(b) by 0 days.

(21) Appl. No.: 17/586,720

(22) Filed: Jan. 27, 2022

(65) Prior Publication Data

US 2023/0194177 A1 Jun. 22, 2023

(30) Foreign Application Priority Data

Dec. 21, 2021 (CN) .......................... 202111571933.2

(51) Int. Cl.
| | | |
|---|---|---|
| F28D 1/02 | (2006.01) | |
| F28F 9/02 | (2006.01) | |
| F28D 21/00 | (2006.01) | |
| H05K 7/20 | (2006.01) | |

(52) U.S. Cl.
CPC ............. F28D 1/02 (2013.01); F28F 9/0209 (2013.01); *F28D 2021/0031* (2013.01); *F28F 2250/08* (2013.01); *H05K 7/20263* (2013.01); *H05K 7/20272* (2013.01)

(58) Field of Classification Search
CPC ... H01L 23/473; G06F 1/20; G06F 2200/201; F28D 2021/0031; H05K 7/20272; H05K 7/20263
See application file for complete search history.

(56) References Cited

U.S. PATENT DOCUMENTS

| | | | |
|---|---|---|---|
| 2006/0018775 A1* | 1/2006 | Oikawa ................. | F04D 29/588 257/E23.098 |
| 2007/0256815 A1* | 11/2007 | Conway ................. | G06F 1/185 165/80.4 |
| 2009/0044929 A1* | 2/2009 | Yeh ......................... | F28D 15/00 165/104.19 |
| 2013/0299139 A1* | 11/2013 | Mounioloux ....... | F28D 1/05375 165/120 |
| 2021/0360825 A1* | 11/2021 | Wu ..................... | H05K 7/20263 |
| 2022/0170705 A1* | 6/2022 | Huang ..................... | F01P 5/10 |
| 2022/0287204 A1* | 9/2022 | Takashima ......... | H05K 7/20327 |

FOREIGN PATENT DOCUMENTS

CN 111880625 A * 11/2020

* cited by examiner

*Primary Examiner* — Eric S Ruppert
(74) *Attorney, Agent, or Firm* — Leong C. Lei

(57) ABSTRACT

A water-cooling heat dissipation device includes a water-cooling radiator. The water-cooling radiator includes a radiating pipe unit, a water outlet reservoir, and a water inlet reservoir. The water-cooling radiator is provided with a first water pump and a second water pump. Each water pump is configured to pump cold water in a corresponding water outlet chamber to a corresponding water-cooling block to exchange heat and become hot water, hot water flows back to a corresponding water inlet chamber and flows into the corresponding radiating pipe unit to be cooled by radiating fins, and then cold water flows into the corresponding water outlet chamber.

2 Claims, 9 Drawing Sheets

WATER-COOLING HEAT DISSIPATION DEVICE

BACKGROUND OF THE INVENTION

1. Field of the Invention

The present invention relates to a water-cooling heat dissipation device, and more particularly to a water-cooling heat dissipation device having built-in water pumps in a water-cooling radiator.

2. Description of the Prior Art

A conventional water-cooling heat dissipation device usually consists of a water-cooling radiator, a water-cooling block, and water pipes. The water pipes are connected between the water-cooling radiator and the water-cooling block. The water pipes allow water in the water-cooling radiator and the water-cooling block to circulate in the water-cooling heat dissipation device. After the water exchanges heat from the water-cooling block, the water flows to the water-cooling radiator for heat dissipation, and the water after heat dissipation flows back to the water-cooling block.

In order to dissipate heat for multiple locations, multiple water-cooling blocks are provided and connected in series. In actual use, after the cold water from the water-cooling radiator passes through the first water-cooling block and then flows into the second water-cooling block, the water temperature has already risen. As a result, the heat exchange effect of the second water-cooling block is not ideal. In another way, part of the cold water from the water-cooling radiator passes through the first water-cooling block and then flows back to the water-cooling radiator, and another part of the cold water from the water-cooling radiator passes through the first water-cooling block and then flows into the second water-cooling block. In the first water-cooling block, it is easy to appear the phenomenon of cold and hot water running around. As a result, the heat exchange effect of the second water-cooling block is not ideal, which affects the overall heat dissipation performance of the water-cooling heat dissipation device.

Accordingly, the inventor of the present invention has devoted himself based on his many years of practical experiences to solve these problems.

SUMMARY OF THE INVENTION

In view of the defects of the prior art, the primary object of the present invention is to provide a water-cooling heat dissipation device. By providing multiple built-in water pumps in a water-cooling radiator for pumping water to respective water-cooling blocks, each water-cooling block has a good heat exchange effect.

In order to achieve the above object, the present invention adopts the following technical solutions:

A water-cooling heat dissipation device comprises a water-cooling radiator. The water-cooling radiator includes a fan bracket, a radiating pipe unit, a water outlet reservoir and a water inlet reservoir respectively disposed at two ends of the radiating pipe unit. The radiating pipe unit includes a plurality of radiating pipes arranged side by side. Radiating fins are provided on the radiating pipes. A first partition is provided in the water outlet reservoir to divide the water outlet reservoir into a first water outlet chamber and a second water outlet chamber. A second partition is provided in the water inlet reservoir to divide the water inlet reservoir into a first water inlet chamber and a second water inlet chamber. The radiating pipe unit includes a first radiating pipe unit and a second radiating pipe unit. The first radiating pipe unit is connected between the first water inlet chamber and the first water outlet chamber. The second radiating pipe unit is connected between the second water inlet chamber and the second water outlet chamber.

The water-cooling radiator is provided with a first water pump and a second water pump.

The first water pump is configured to pump cold water in the first water outlet chamber to a first water-cooling block to exchange heat and become hot water, hot water flows back to the first water inlet chamber and flows into the first radiating pipe unit to be cooled by the radiating fins, and then cold water flows into the first water outlet chamber.

The second water pump is configured to pump cold water in the second water outlet chamber to a second water-cooling block to exchange heat and become hot water, hot water flows back to the second water inlet chamber and flows into the second radiating pipe unit to be cooled by the radiating fins, and then cold water flows into the second water outlet chamber.

Compared with the prior art, the present invention has obvious advantages and beneficial effects. Specifically, it can be known from the above technical solutions. The water-cooling radiator is provided with multiple built-in water pumps for pumping water to the respective water-cooling blocks separately. Each water pump is configured to pump cold water in the corresponding water outlet chamber to the corresponding water-cooling block to exchange heat and become hot water, hot water flows back to the corresponding water inlet chamber and flows into the corresponding radiating pipe unit to be cooled by the radiating fins, and then cold water flows into the corresponding water outlet chamber. Each water-cooling block has a good heat exchange effect.

DETAILED DESCRIPTION OF THE PREFERRED EMBODIMENTS

Figure 1:
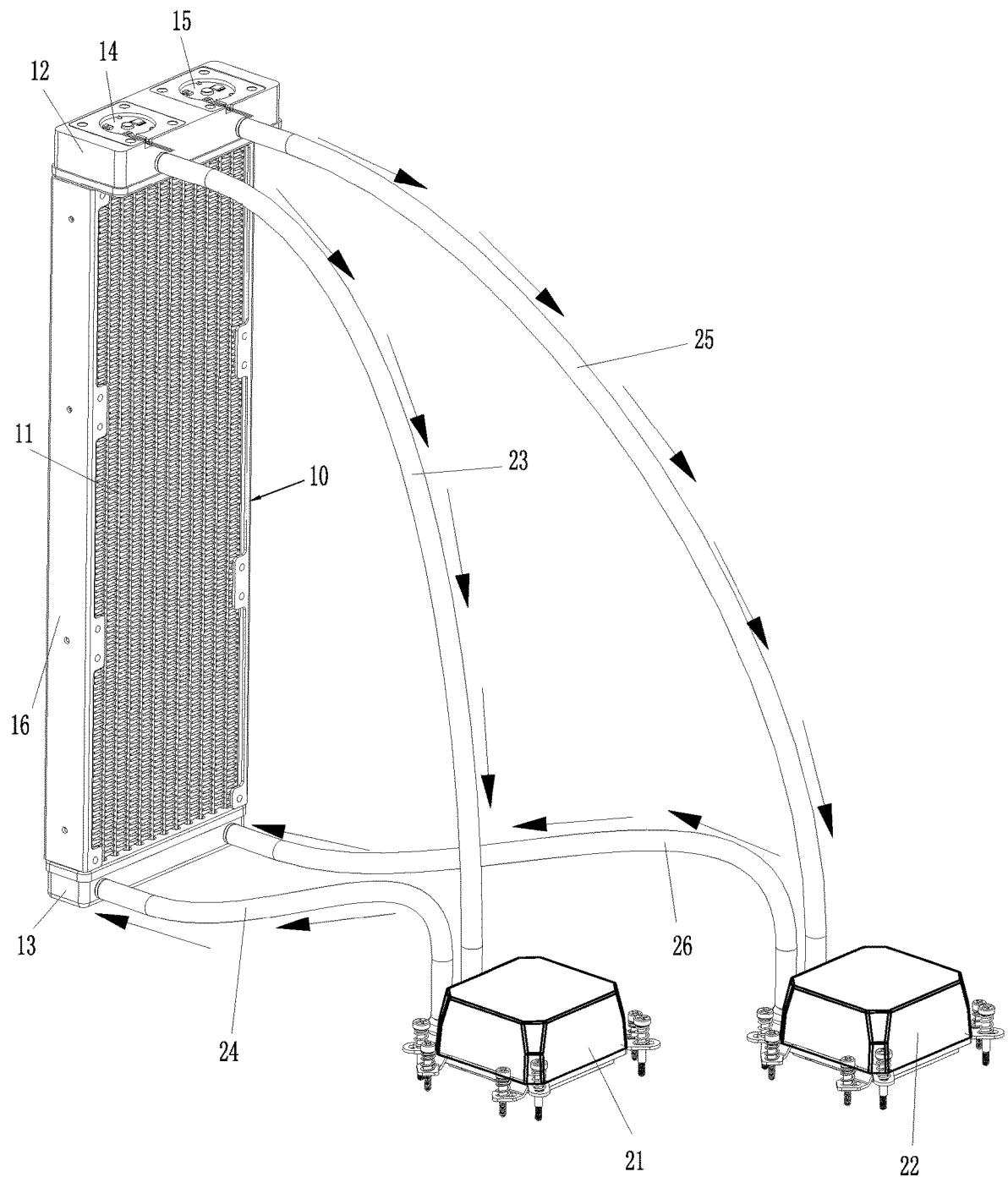
FIG. 1 is a perspective view according to a first embodiment of the present invention.
Figure 2:
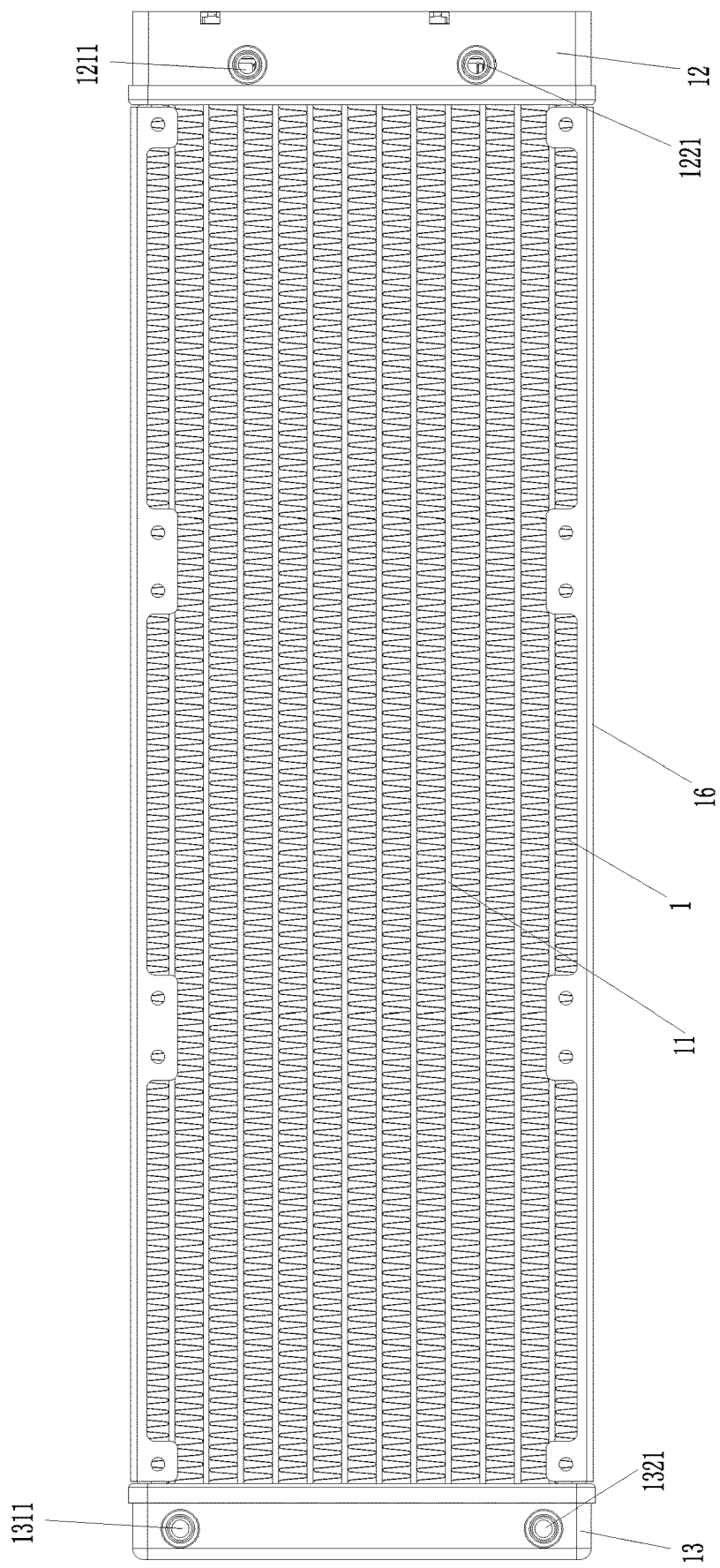
FIG. 2 is a top view of the water-cooling radiator according to the first embodiment of the present invention.
Figure 3:
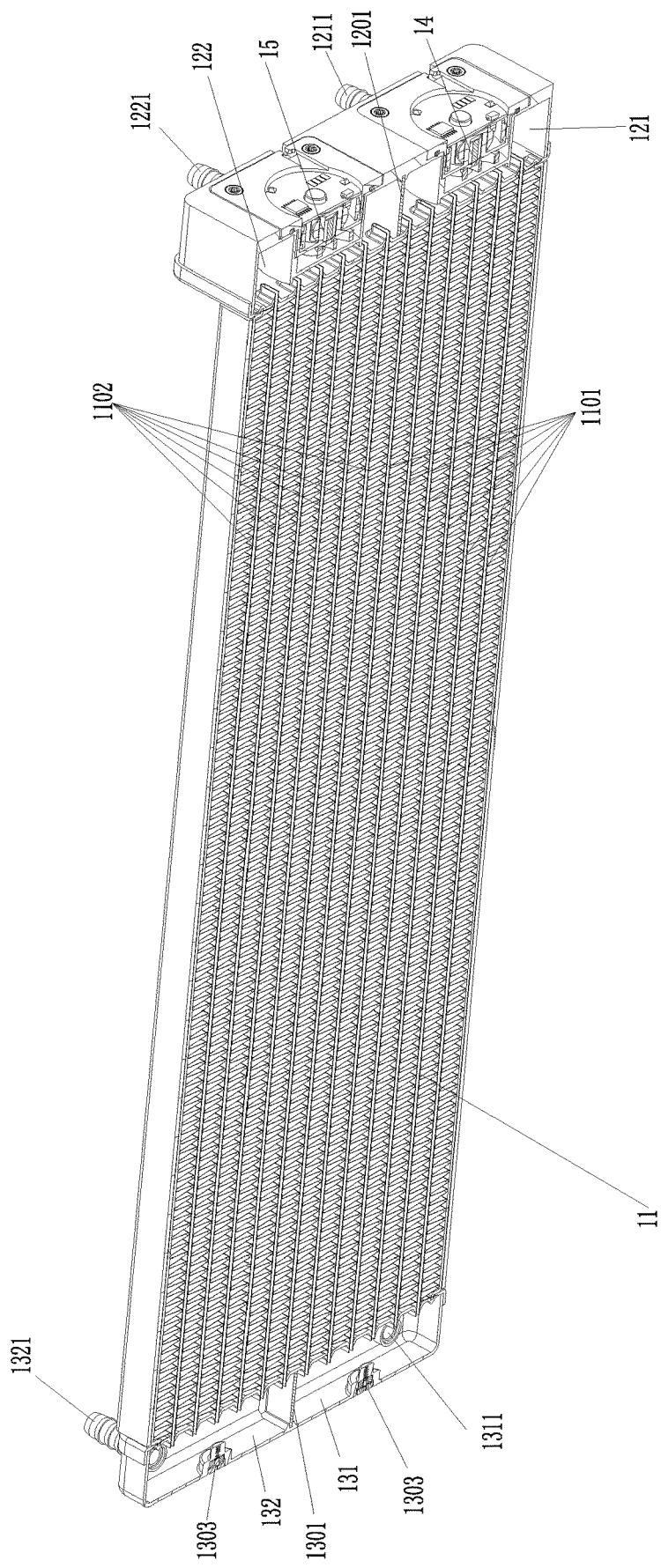
FIG. 3 is a perspective view of the water-cooling radiator according to the first embodiment of the present invention.

FIGS. 1 to 9 show the specific structures of plural embodiments of the present invention.

FIGS. 1 to 5 show the specific structure of a first embodiment of the present invention.

A water-cooling heat dissipation device comprises a water-cooling radiator 10. The water-cooling radiator 10 includes a fan bracket 16, a radiating pipe unit 11, a water outlet reservoir 12 and a water inlet reservoir 13 respectively disposed at both ends of the radiating pipe unit 11. The radiating pipe unit 11 includes a plurality of radiating pipes arranged side by side. Radiating fins 1 are provided on the radiating pipes.

A first partition 1201 is provided in the water outlet reservoir 12 to divide the water outlet reservoir 12 into a first water outlet chamber 121 and a second water outlet chamber 122. A second partition 1301 is provided in the water inlet reservoir 13 to divide the water inlet reservoir 13 into a first water inlet chamber 131 and a second water inlet chamber 132. The first water inlet chamber 131 and the second water inlet chamber 132 each have a water injection hole 13202. The water injection 1302 is provided with a screw 1303 that is detachably blocked in the water injection hole 1302. The screw 1303 is provided with a sealing ring 1304.

The radiating pipe unit 11 includes a first radiating pipe unit 1101 and a second radiating pipe unit 1102. The first radiating pipe unit 1101 is connected between the first water inlet chamber 131 and the first water outlet chamber 121. The second radiating pipe unit 1102 is connected between the second water inlet chamber 132 and the second water outlet chamber 122.

The water-cooling radiator 10 is provided with a first water pump 14 and a second water pump 15. The first water pump 14 is configured to pump cold water in the first water outlet chamber 121 to a first water-cooling block 21 to exchange heat and become hot water, and then hot water flows back to the first water inlet chamber 131 and flows into the first radiating pipe unit 1101 to be cooled by the radiating fins 1, and then cold water flows into the first water outlet chamber 121. The cycle is repeated in this way. The second water pump 15 is configured to pump cold water in the second water outlet chamber 122 to a second water-cooling block 22 to exchange heat and become hot water, and then hot water flows back to the second water inlet chamber 132 and flows into the second radiating pipe unit 1102 to be cooled by the radiating fins 1, and then cold water flows into the second water outlet chamber 122. The cycle is repeated in this way.

Figure 4:
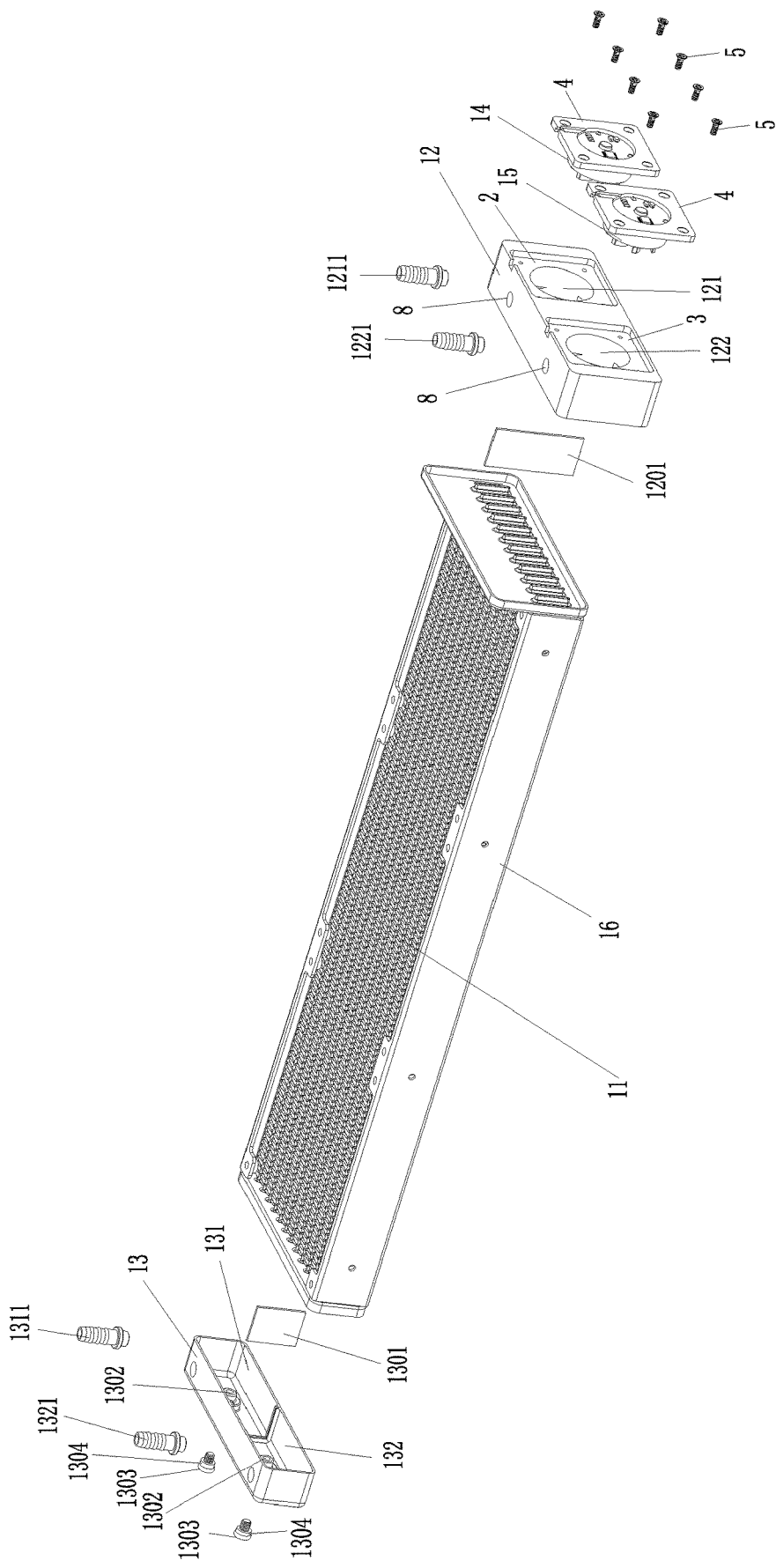
FIG. 4 is an exploded view of the water-cooling radiator according to the first embodiment of the present invention.
Figure 5:
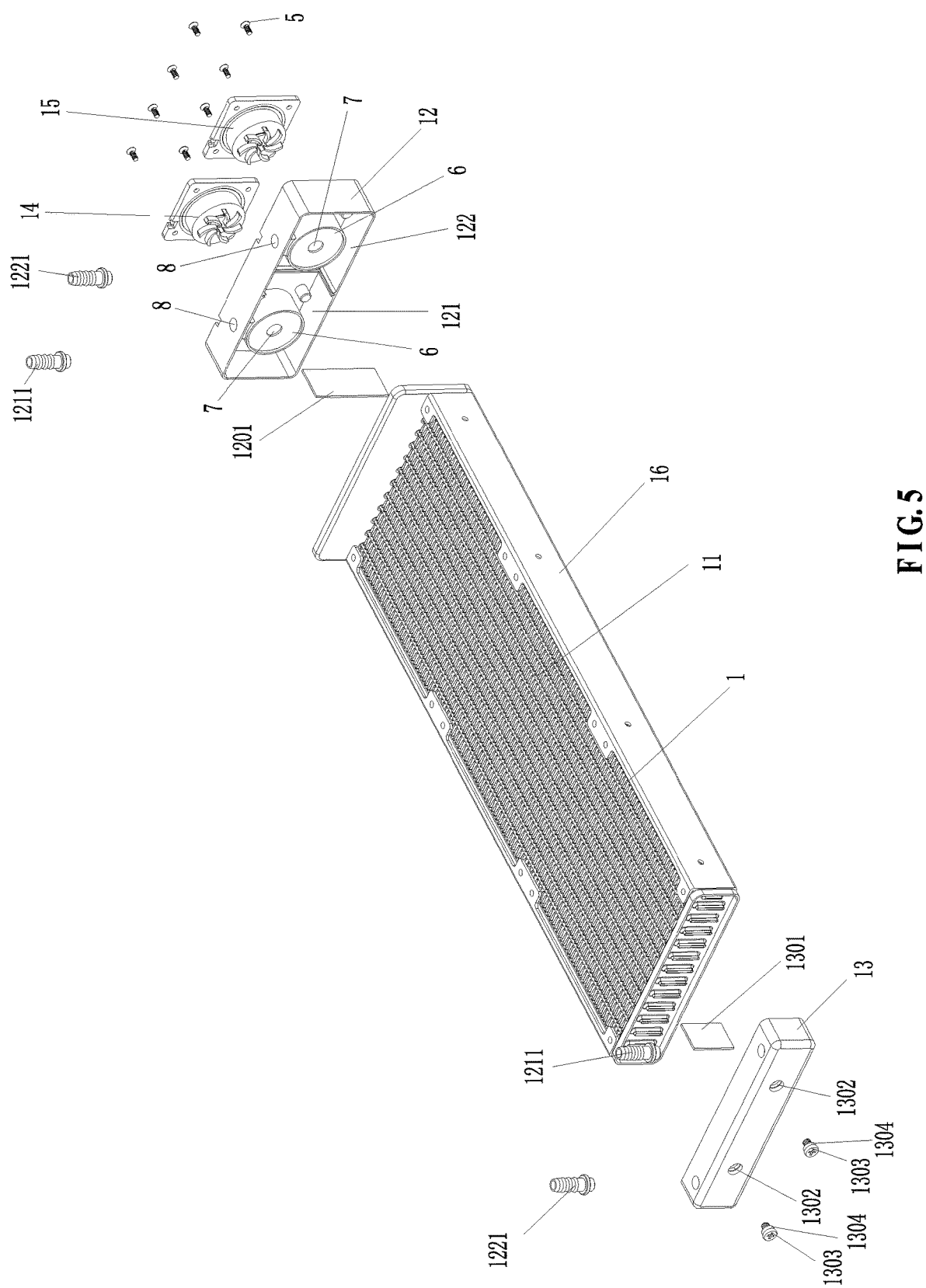
FIG. 5 is another exploded view of the water-cooling radiator according to the first embodiment of the present invention.

The first water pump 14 is mounted in the first water outlet chamber 121, and the second water pump 15 is mounted in the second water outlet chamber 122. Specifically, as shown in FIG. 4 and FIG. 5, an outer end plate of the water outlet reservoir 12 is recessed to form a first water pump mounting recess 2 and a second water pump mounting recess 3. The first water pump mounting recess 2 and the second water pump mounting recess 3 have through holes to communicate with the first water outlet chamber 121 and the second water outlet chamber 122, respectively. The first water pump 14 and the second water pump 15 each have a water pump body and an end cover plate 4 connected to the outer end of the water pump body. The water pump bodies of the first water pump 14 and the second water pump 15 are inserted into the through holes of the first water pump mounting recess 2 and the second water pump mounting recess 3, respectively. The end cover plates 4 of the first water pump 14 and the second water pump 15 are located in the first water pump mounting recess 2 and the second water pump mounting recess 3, respectively. A plurality of locking screws 5 are screwed to the screw holes of the end cover plates 4 and the screw holes of the first water pump mounting recess 2 and the second water pump mounting recess 3, respectively. In this way, the first water pump 14 and the second water pump 15 are installed and positioned. Besides, the through holes are covered by the end cover plates 4 of the first water pump 14 and the second water pump 15. A sealing ring may be provided. Preferably, two water pump mounting chambers 6 are integrally formed with the outside of the water outlet reservoir 12. The outer ends of the water pump mounting chambers 6 are open to form the through holes. The inner end plate of each water pump mounting chamber 6 is formed with a water hole 7. The first water outlet chamber 121 and the second water outlet chamber 122 each have a water outlet 8. The water holes 7 of the water pump mounting chambers 6 communicate with the corresponding first water outlet chamber 121 and the second water outlet chamber 122 respectively, so that cold water flows into the water pump mounting chambers 6 from the corresponding first water outlet chamber 121 and the second water outlet chamber 122 through the respective water holes 7, and then flows out from the respective water outlets 8.

The first water outlet chamber 121 is connected with a first water outlet fitting 1211. The second water outlet chamber 122 is connected with a second water outlet fitting 1221. The first water inlet chamber 131 is connected with a first water inlet fitting 1311. The second water inlet chamber 132 is connected with a second water inlet fitting 1321. The first water-cooling block 21 is connected to the first water outlet fitting 1211 of the first water outlet chamber 121 through a first water input tube 23. The first water-cooling block 21 is connected to the first water inlet fitting 1311 of the first water inlet chamber 131 through a first water output tube 24. The second water-cooling block 22 is connected to the second water outlet fitting 1221 of the second water outlet chamber 122 through a second water input tube 25. The second water-cooling block 22 is connected to the second water inlet fitting 1321 of the second water inlet chamber 132 through a second water output tube 26.

Figure 6:
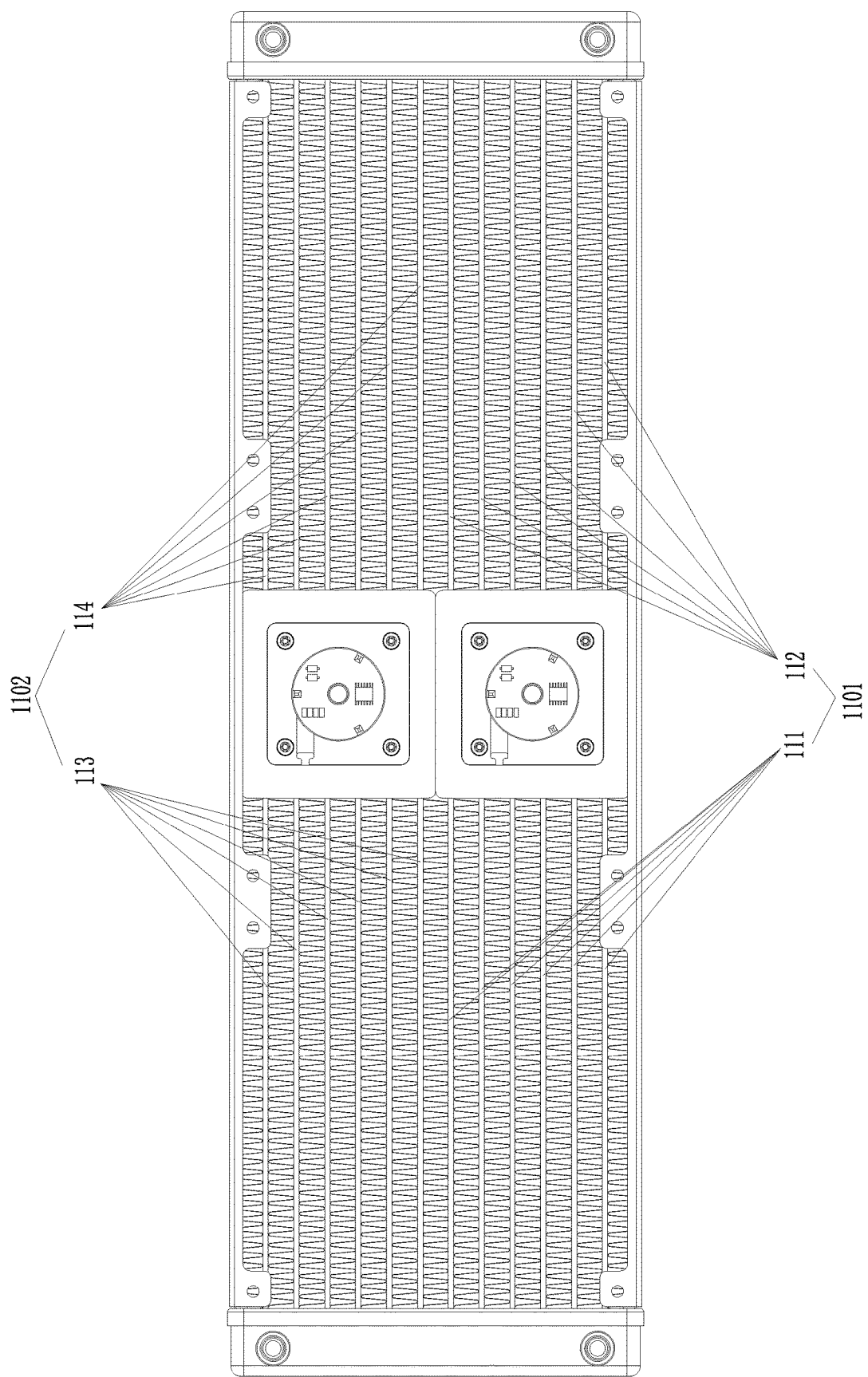
FIG. 6 is a top view of the water-cooling radiator according to a second embodiment of the present invention.
Figure 7:
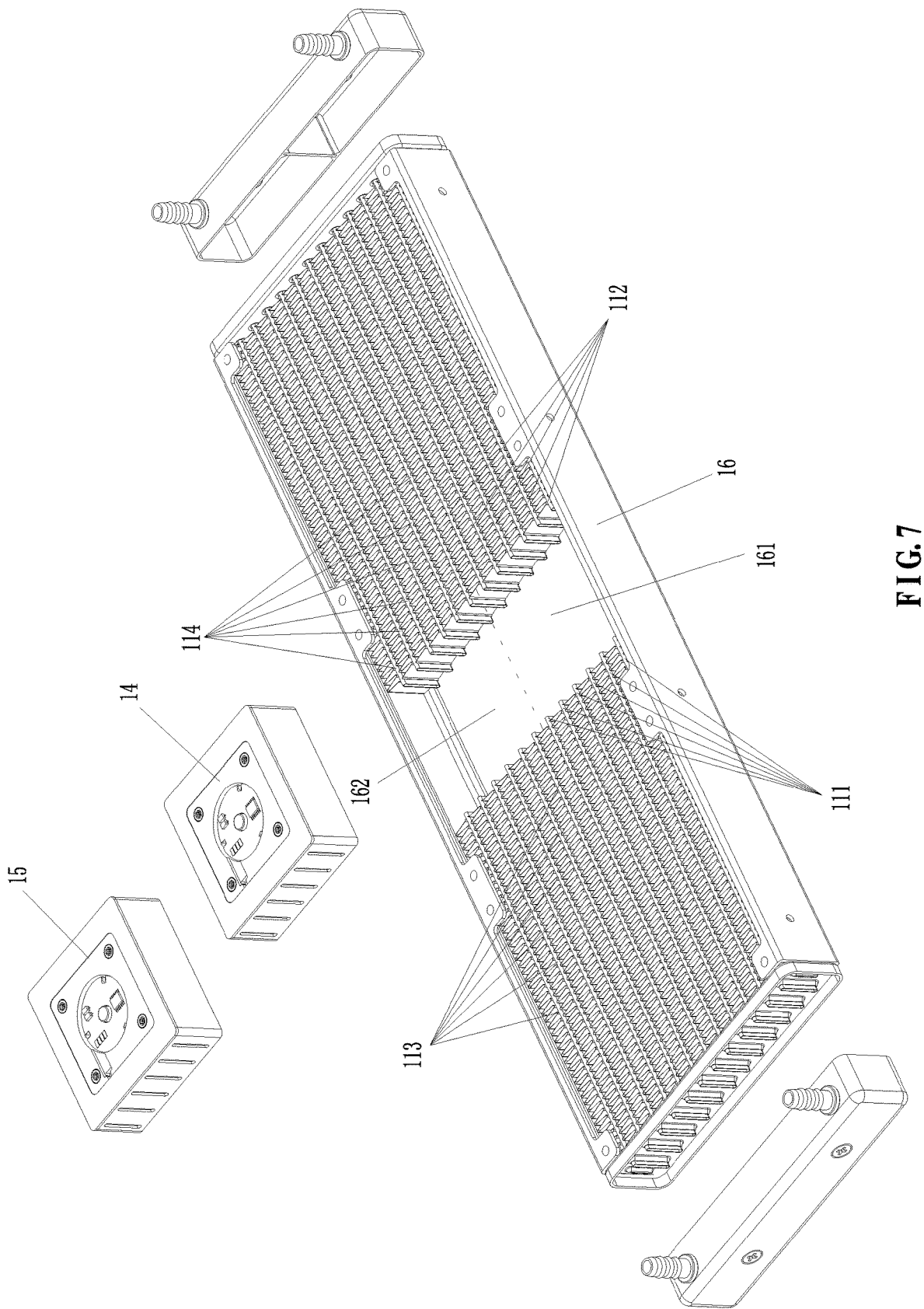
FIG. 7 is an exploded view of the water-cooling radiator according to the second embodiment of the present invention.
Figure 8:
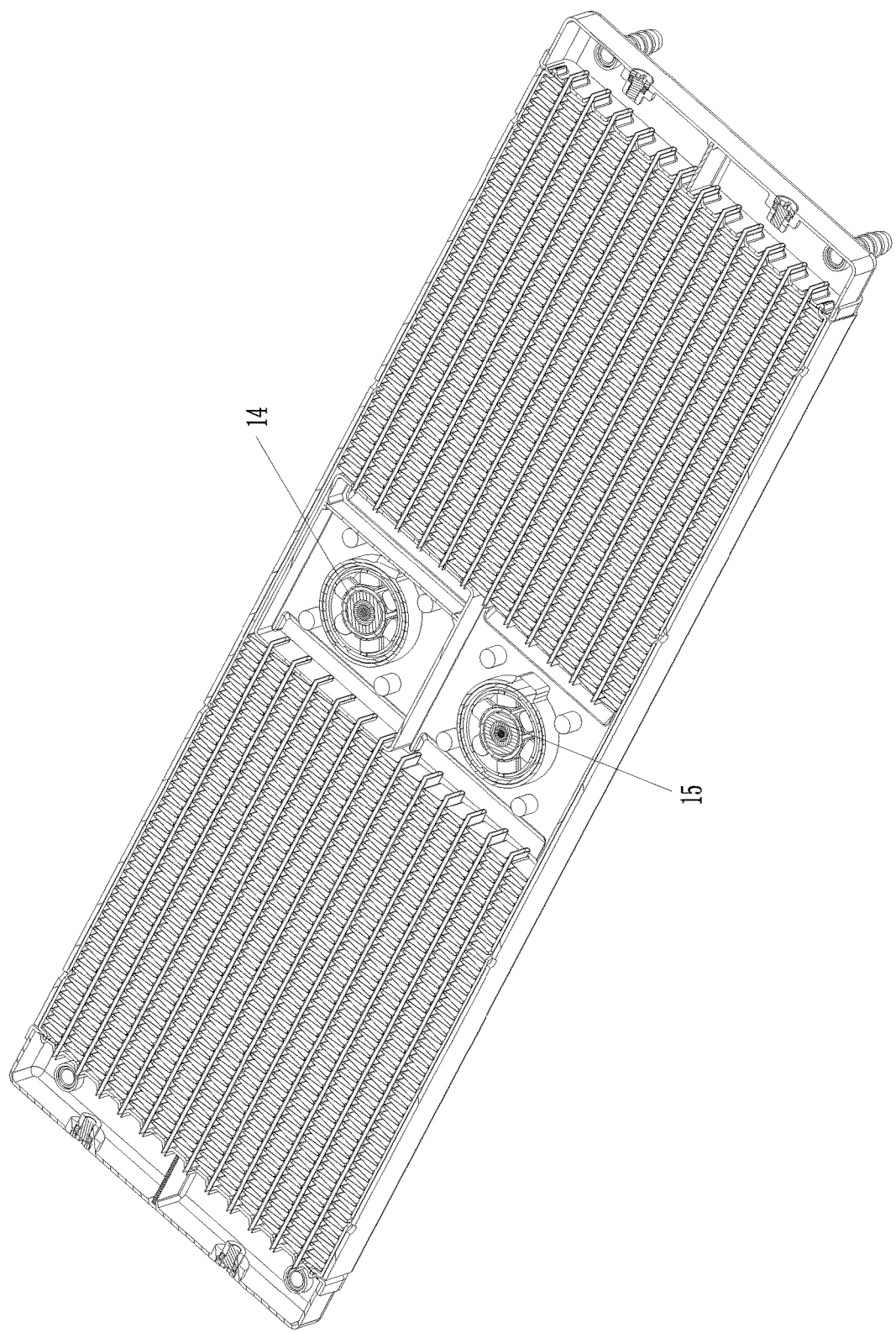
FIG. 8 is a perspective view of the water-cooling radiator according to the second embodiment of the present invention.

FIGS. 6 to 8 show the specific structure of a second embodiment of the present invention. The second embodiment is substantially similar to the first embodiment with the exceptions described hereinafter.

The first water pump 14 is mounted to the first radiating pipe unit 1101. The first radiating pipe unit 1101 includes first pump front radiating pipes 111 and first pump rear radiating pipes 112. The first water pump 14 is connected between the first pump front radiating pipes 111 and the first pump rear radiating pipes 112. The second water pump 15 is mounted to the second radiating pipe unit 1102. The second radiating pipe unit 1102 includes second pump front radiating pipes 113 and second pump rear radiating pipes 114. The second water pump 15 is connected between the second pump front radiating pipes 113 and the second pump rear radiating pipes 114. The first water pump 14 and the second water pump 15 are arranged side by side. Preferably, the first water pump 14 and the second water pump 15 are arranged side by side in a middle position of the radiating pipe unit 11. The fan bracket 16 is provided with a first water pump mounting chamber 161 and a second water pump mounting chamber 162. The first water pump 14 is located in the first water pump mounting chamber 161, and the second water pump 15 is located in the second water pump mounting chamber 162.

Figure 9:
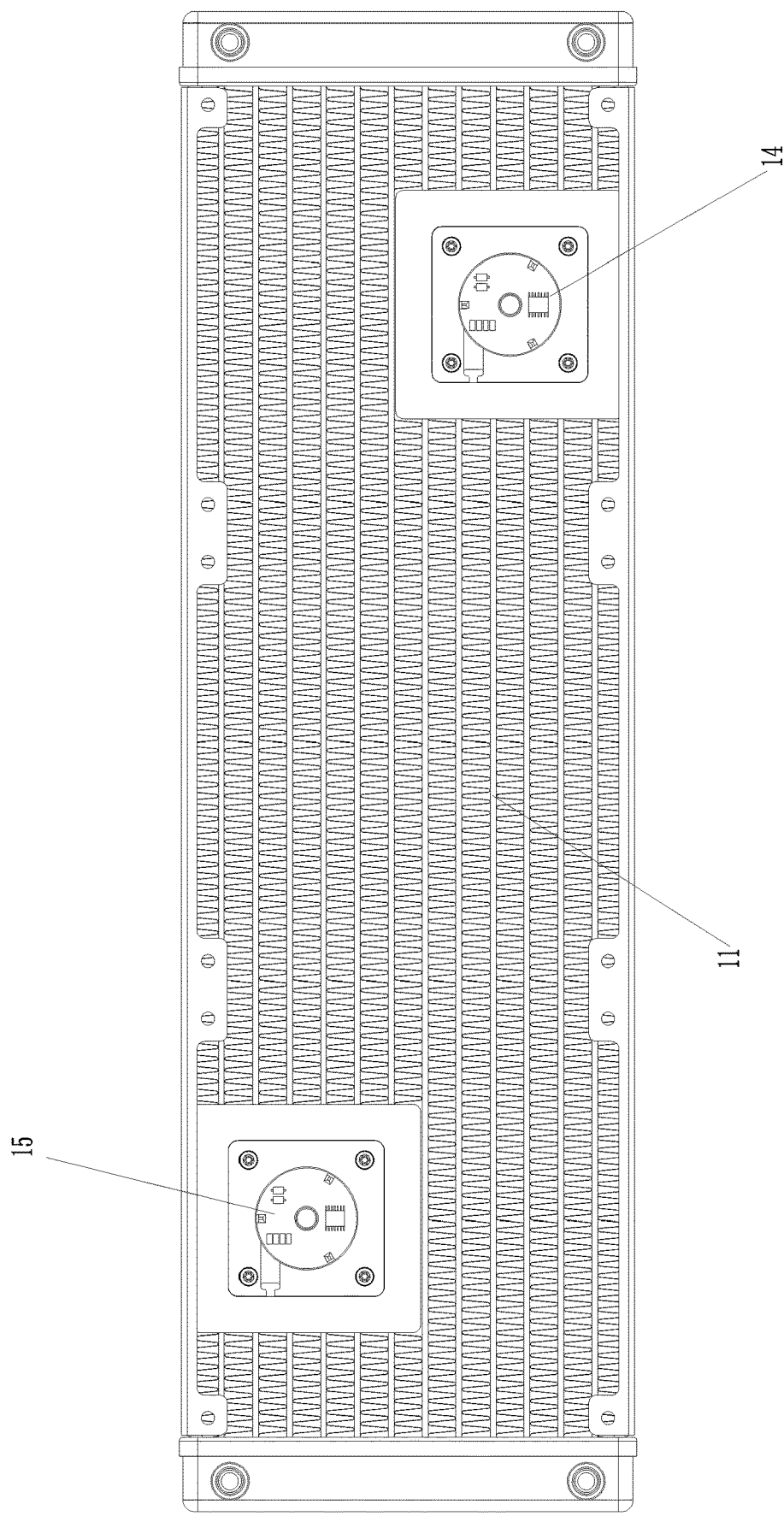
FIG. 9 is a top view of the water-cooling radiator according to a third embodiment of the present invention.

FIG. 9 shows the specific structure of a third embodiment of the present invention. The third embodiment is substantially similar to the second embodiment with the exceptions described hereinafter. The first water pump 14 and the second water pump 15 are staggered. Preferably, the first water pump 14 and the second water pump 15 are arranged on both ends of the radiating pipe unit 11, respectively. The staggered arrangement can reduce the space occupied by the first water pump 14 and the second water pump 15 that are arranged side by side, which is beneficial for the space arrangement.

What is claimed is:

1. A water-cooling heat dissipation device, comprising a water-cooling radiator, the water-cooling radiator including a fan bracket, a radiating pipe unit, a water outlet reservoir and a water inlet reservoir respectively disposed at two ends of the radiating pipe unit; the radiating pipe unit including a plurality of radiating pipes arranged side by side, radiating fins being provided on the radiating pipes; a first partition being provided in the water outlet reservoir to divide the water outlet reservoir into a first water outlet chamber and a second water outlet chamber, a second partition being provided in the water inlet reservoir to divide the water inlet reservoir into a first water inlet chamber and a second water inlet chamber; the radiating pipe unit including a first radiating pipe unit and a second radiating pipe unit, the first radiating pipe unit being connected between the first water inlet chamber and the first water outlet chamber, the second radiating pipe unit being connected between the second water inlet chamber and the second water outlet chamber;

the water-cooling radiator being provided with a first water pump and a second water pump;

the first water pump being configured to pump cold water in the first water outlet chamber to a first water-cooling block to exchange heat and become hot water, hot water flowing back to the first water inlet chamber and flowing into the first radiating pipe unit to be cooled by the radiating fins, and then cold water flowing into the first water outlet chamber;

the second water pump being configured to pump cold water in the second water outlet chamber to a second water-cooling block to exchange heat and become hot water, hot water flowing back to the second water inlet chamber and flowing into the second radiating pipe unit to be cooled by the radiating fins, and then cold water flowing into the second water outlet chamber, wherein the first water pump is mounted in the first water outlet chamber, and the second water pump is mounted in the second water outlet chamber; and, wherein an outer end plate of the water outlet reservoir is recessed to form a first water pump mounting recess and a second water pump mounting recess, the first water pump mounting recess and the second water pump mounting recess have through holes to communicate with the first water outlet chamber and the second water outlet chamber respectively, the first water pump and the second water pump each have a water pump body and an end cover plate connected to an outer end of the water pump body; the water pump bodies of the first water pump and the second water pump are inserted into the through holes of the first water pump mounting recess and the second water pump mounting recess respectively, the end cover plates of the first water pump and the second water pump are located in the first water pump mounting recess and the second water pump mounting recess, respectively;

two water pump mounting chambers are integrally formed with an outside of the water outlet reservoir, outer ends of the water pump mounting chambers are open to form the through holes; the first water outlet chamber and the second water outlet chamber each have a water outlet; an inner end plate of each water pump mounting chamber is formed with a water hole, the water holes of the water pump mounting chambers communicate with the corresponding first water outlet chamber and the second water outlet chamber respectively, so that cold water flows into the water pump mounting chambers from the corresponding first water outlet chamber and the second water outlet chamber through the respective water holes and then flows out from the respective water outlets.

2. The water-cooling heat dissipation device as claimed in claim 1, wherein the first water outlet chamber is connected with a first water outlet fitting, the second water outlet chamber is connected with a second water outlet fitting;

the first water inlet chamber is connected with a first water inlet fitting, the second water inlet chamber is connected with a second water inlet fitting;

the first water-cooling block is connected to the first water outlet fitting of the first water outlet chamber through a first water input tube, the first water-cooling block is connected to the first water inlet fitting of the first water inlet chamber through a first water output tube; the second water-cooling block is connected to the second water outlet fitting of the second water outlet chamber through a second water input tube, and the second water-cooling block is connected to the second water inlet fitting of the second water inlet chamber through a second water output tube.

* * * * *